United States Patent [19]

Brown

[11] Patent Number: 4,827,316

[45] Date of Patent: May 2, 1989

[54] PRINTING FRAME

[76] Inventor: Silas Brown, P.O. Box 86, Marine St. Croix, Minn. 55047

[21] Appl. No.: 165,486

[22] Filed: Mar. 8, 1988

[51] Int. Cl.⁴ .................. G03B 27/02; G03B 27/20; G03B 27/32; G03B 27/52

[52] U.S. Cl. ........................... 355/79; 355/26; 355/91; 355/94

[58] Field of Search ............... 355/26, 79, 91, 94

[56] References Cited

U.S. PATENT DOCUMENTS

| | | |
|---|---|---|
| 3,199,430 | 8/1965 | Brown . |
| 3,531,198 | 9/1970 | Delp ................. 355/26 |
| 3,619,056 | 11/1971 | Hantusch et al. ........... 355/91 |
| 3,645,621 | 2/1972 | Wally, Jr. . |
| 3,695,760 | 10/1972 | Orr . |
| 3,762,816 | 10/1973 | Wally, Jr. . |
| 3,798,782 | 3/1974 | Lindahl .............. 355/79 |
| 4,089,603 | 5/1978 | Jacobs ............... 355/91 |
| 4,423,954 | 1/1984 | Curti . |
| 4,494,867 | 1/1985 | Wally, Jr. . |
| 4,525,061 | 6/1985 | Oki . |
| 4,582,422 | 4/1986 | Stroud . |

Primary Examiner—Monroe H. Hayes
Attorney, Agent, or Firm—Orrin M. Haugen; Thomas J. Nikolai; Frederick W. Niebuhr

[57] ABSTRACT

A frame for properly aligning to glass masters on opposite sides of a substrate is disclosed. The frame includes: (a) first alignment means comprised of spherical balls projecting from one frame member intended to mate with associated concave ball receiving surfaces associated with the other frame member; and (b) second alignment means comprised of pins capable of being inserted into bores in one frame member and pin seats in the second frame member. The frame also includes a pump and solenoid valve. Depending upon the position of the valve, the pump will either draw air from between the frame members to close the frame or push air between the frame members to open the frame.

10 Claims, 3 Drawing Sheets

PRINTING FRAME

BACKGROUND OF THE INVENTION

I. Field of the Invention:

The present invention relates to a frame used in the production of printed circuit boards. More particularly, the present invention relates to a frame for aligning and securely retaining two glass masters and a substrate upon which printing will be done.

II. Description of the Prior Art:

In conjunction with recent advances in photograph, graphics and printed circuit board arts, a variety of devices for retaining and aligning master patterns with surfaces for printing have been developed. Such devices include those shown in U.S. Pat. No. 4,525,061 dated June 25, 1985 to Toshiro Oki; U.S. Pat. No. 4,582,422 dated Apr. 15, 1986 to Edward J. Stroud; U.S. Pat. No. 4,494,867, 3,762,816 and 3,645,612 to Joseph H. Wally, Jr. which are dated Jan. 22, 1985, Oct. 2, 1973 and Feb. 29, 1972 respectively; U.S. Pat. No. 4,423,954 dated Jan. 3, 1984 to Ezio Curti; and U.S. Pat. No. 3,695,760 dated Oct. 3, 1972 to Alexander L. Orr. One of the coinventor's (i.e. S. A. Brown) earlier U.S. Pat. No. 3,199,430 dated Aug. 10, 1965 also relates to frame for aligning printing elements in exact registry with one another to photographically reproduce images on opposite sides of a sheet of light sensitive material.

A real problem relating to the manufacture of printed circuits arises from the competing desires for speed and accuracy. The systems generally used today either are too time consuming to use so that the cost of the resulting products is inordinately high or too inaccurate so that many of the products are rejected. Hence, there is a real need in the art for a frame used in the manufacture of printed circuits which is fast and accurate, and, thus, more reliable and efficient than the frames which are commercially available today.

SUMMARY OF THE INVENTION

The frame of the present invention is designed in three separate pieces so that a substrate upon which printing will be done can be sandwiched between two glass masters which, in turn, are associated with members of the frame. One of the frame members has a separate shaft projecting perpendicularly from each of the four corners of its inside plane. Each of these four shafts terminate in a spherical dome. These shafts and domes pass through the middle frame member and are extended to engage the concave surface of a piston associated with the third frame member to align all three frame members, the glass master and the substrate upon which printing is to be done within certain rough tolerances.

To provide closer tolerances, the frame of the present invention is provided with a plurality of alignable holes and adjustment pins. Still closer tolerances and automatic operation can be achieved through the uses of a vacuum system. The vacuum system is used to close the frame, draw the frame down, and hold the frame members together. This vacuum system includes a plurality of ports, tubes and plumbing connections to properly join the frame to a pump. As the vacuum is applied, air is removed from between the frame members and from between the glass masters and the substrate, thus, drawing the frame members together. The spherical domes and mating concave surfaces referred to above co-act to provide proper alignment. Placing a valve into the vacuum system between the pump and the frame also permits the vacuum system to be used to open and close the frame.

OBJECTS

A principle object of the present invention is to provide a frame for aligning and retaining in aligned position a pair of glass masters with an associated substrate sandwiched between the masters upon which double-sided printing is to be done.

Another object of the present invention is to provide such a frame which includes means for quickly and accurately aligning the masters and substrate.

Still another object of the present invention is to provide such a frame which includes multiple means for aligning the masters and substrate depending upon the positional tolerances required.

A further object of the present invention is to provide such a photographic or printed circuit exposure frame having a vacuum system which includes a valve capable of being used to efficiently open and close the frame, draw the frame down, and hold the members of the frame together.

Still a further object of the invention is to provide such a frame of the type described which is made of sufficiently durable materials so that it will not lose alignment due to warpage or wear of the parts.

These and other objects of the present invention will become more readily apparent from a reading of the following Detailed Description of the Invention and the appended claims in conjunction with the associated drawings.

DETAILED DESCRIPTION OF THE INVENTION

Figure 1:
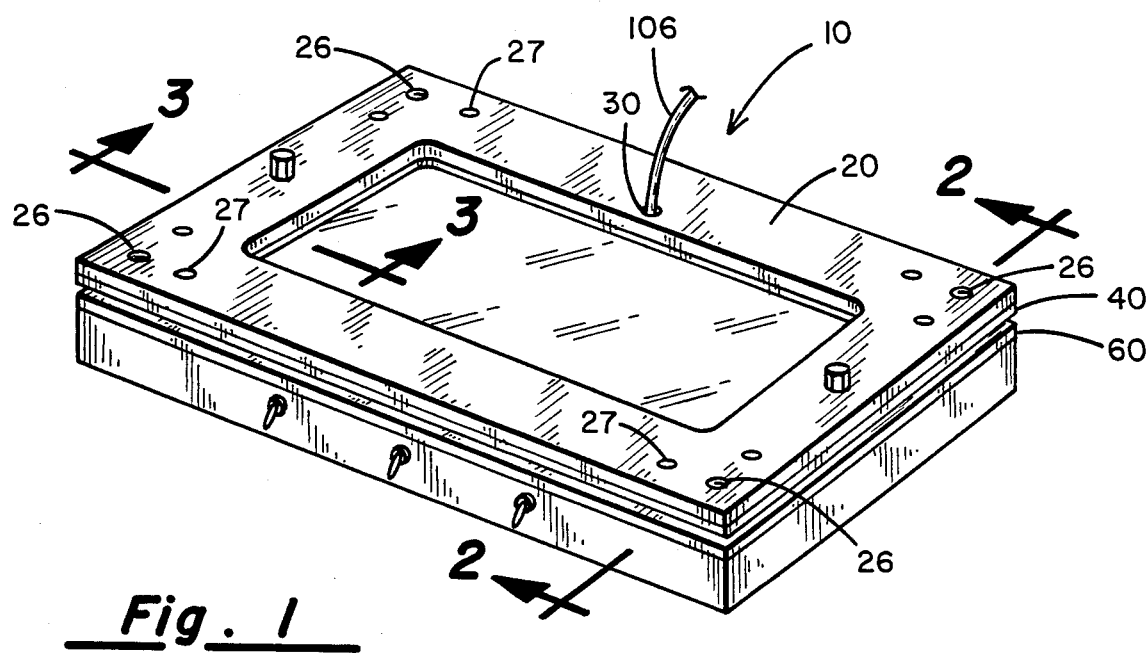
FIG. 1 is a perspective view of a preferred embodiment of the printing frame of the present invention.

As shown in FIG. 1, the printing frame of the present invention is indicated generally by numeral 10 and includes a first frame member 20, a second frame member 40 and a third frame member 60. Preferably, frame members 20, 40 and 60 are each fabricated from a solid piece of aluminum so as to be light in weight, durable and resistant to warpage.

Figure 4:
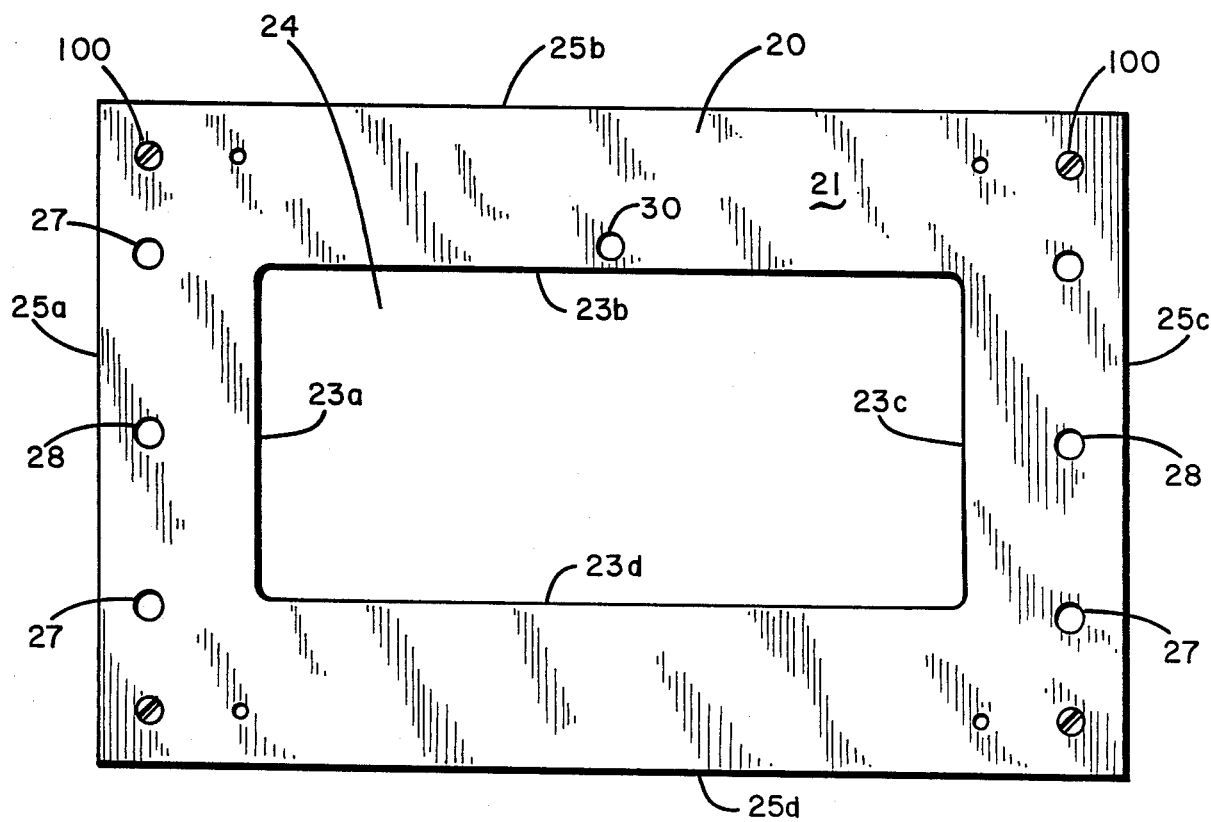
FIG. 4 is a top view of the printing frame of FIG. 1.

As best shown in FIG. 4, in the preferred embodiment, the first frame member 20 is rectangular in shape and includes a top surface 21, a bottom surface 22, four inside surfaces 23a, 23b, 23c, and 23d surrounding an opening 24, and four outside surfaces 25a, 25b, 25c and 25d. Running through said first frame member 20 from the top surface 21 to the bottom surface 22 near each of the corners of said surfaces 21 and 22 is a bore 26. The bores 26 each receive a screw 100 which is used to fasten a shaft 101 (FIG. 2) to the underside of frame member 20. Shaft 101 terminates in a spherical dome 102, the purpose of which is discussed in greater detail below.

Also passing through frame member 20 are bores 27. Bores 27 are intended to receive tap pins 103 which are intended to help align and secure the frame members together. Bores 28 are intended to receive threaded pins 104 which are secured to the frame member 40 and are used to adjust the alignment or orientation between the frame members 20 and 40 and, along with nut 105, are used to tighten members 20 and 40 together. Finally, bore 30 is intended to accept a vacuum hose 106 which passes through it.

Figure 2:
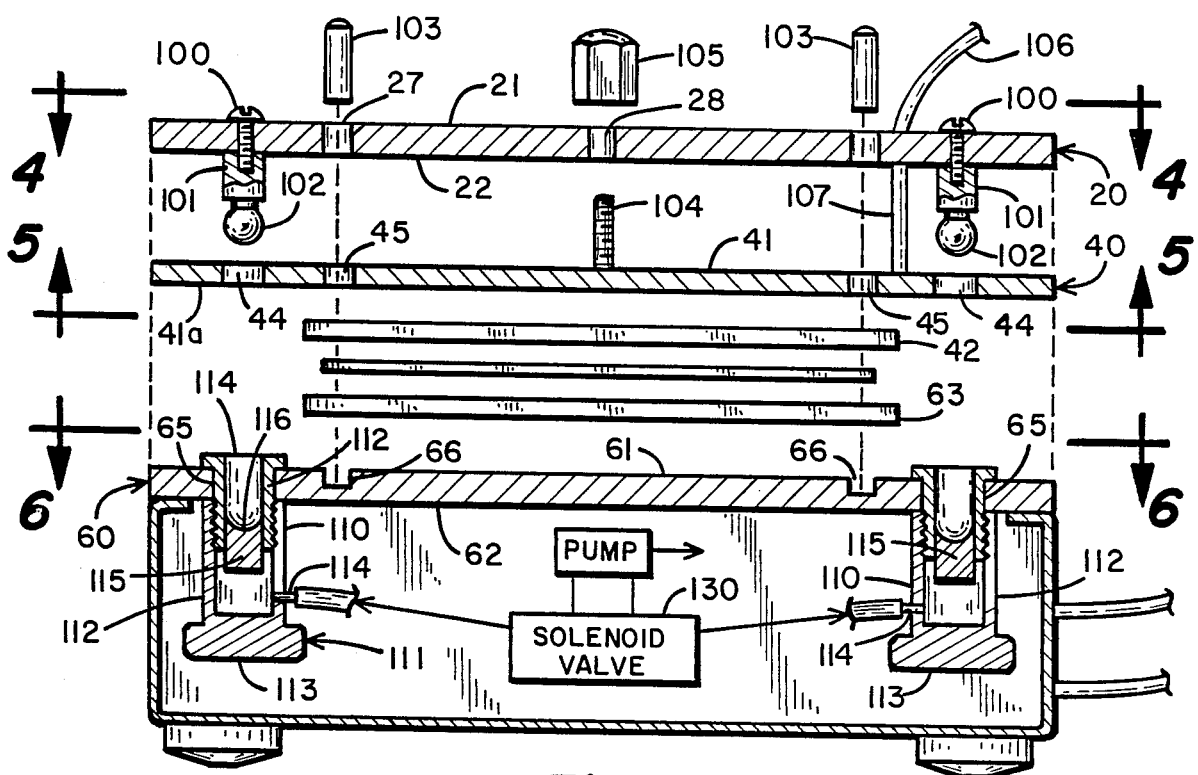
FIG. 2 is a blown-apart sectional view taken along the lines the 2—2 in FIG. 1.
Figure 3:
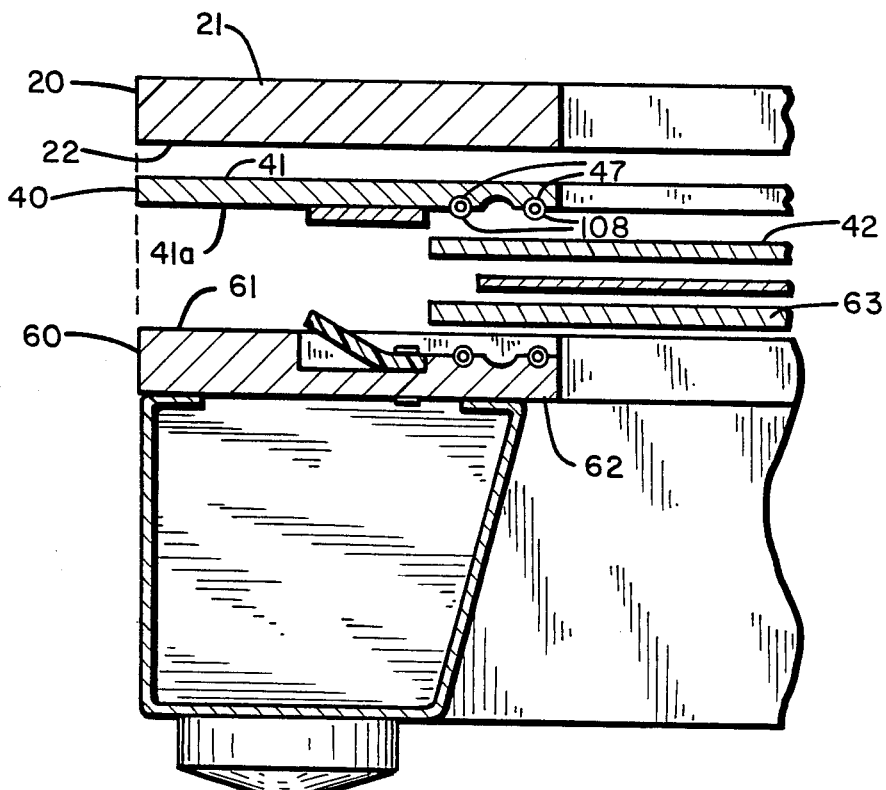
FIG. 3 is an enlarged sectional view taken along the lines 3—3 of FIG. 1.
Figure 5:
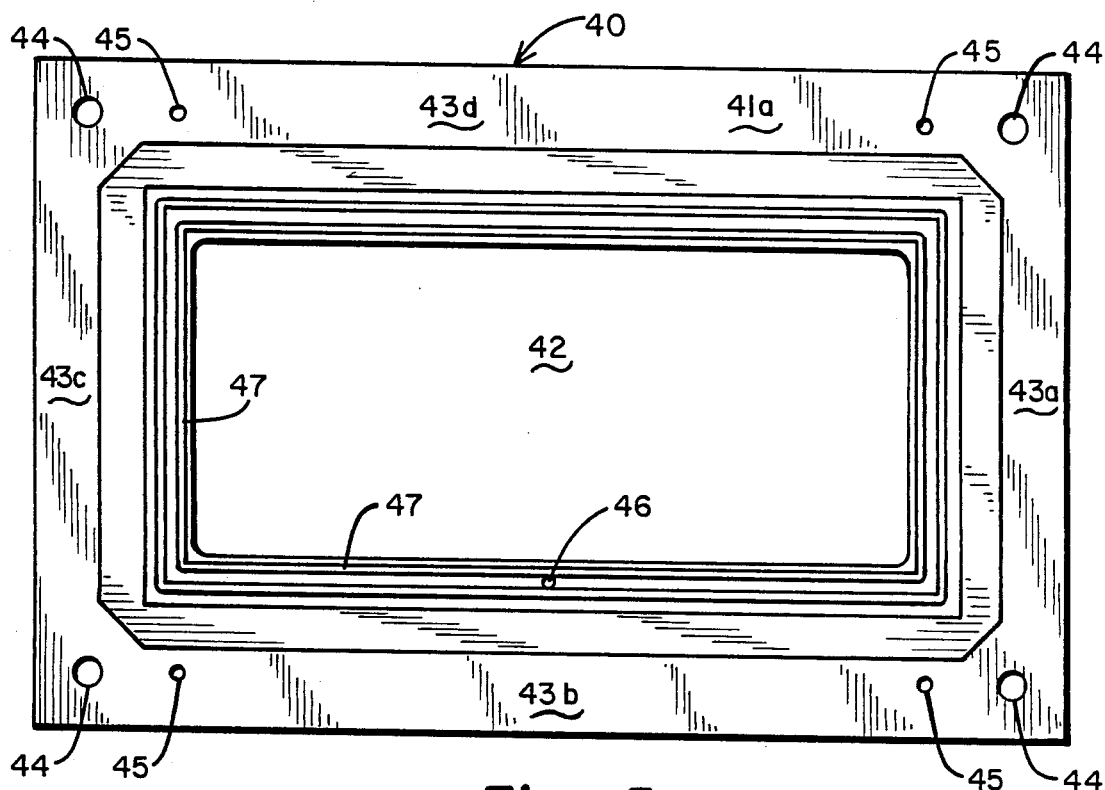
FIG. 5 is a bottom view of the middle plate portion of the frame assembly taken along the lines 5—5 of FIG. 2 and rotated 90°.

FIGS. 2, 3 and 5 are intended to show in detail the construction of the frame member 40. Frame member 40 has a top surface 41 which is intended to be placed in face-to-face registration with the bottom surface 22 of frame member 20. Frame 40 also has a bottom surface 41a. Associated with the bottom surface 41a of frame member 40 is a glass master 42, the main printing portion of which is surrounded by metal rails 43a, 43b, 43c and 43d of frame 40. At each of the corners formed by the rails 43 are bores 44. Bores 44 are positioned so that when the frame is assembled, shaft 101 and dome 102 (FIG. 2) can pass through them.

Frame member 40 also include a plurality of bores 45. Bores 45 are intended to be aligned with bores 27 of frame member 20 to receive tap pins 103 which help align and secure the frame members in place.

Another feature of mid-frame member 40 is a vacuum hose connector 107 (FIG. 2) which is used to join the hose 106 to frame member 40. When in use, this hose can be used to create a vacuum between the outside edges of the glass master 42 and the rails 43a through 43d of member 40. Connector 107 passes through and seats in bore 46 of frame member 40.

Also associated with frame member 40 and used to help create the requisite vacuum between the edges of glass master 42 and the rails 43 are a pair of interior, elastomeric gaskets 108 (FIG. 3) which have a tubular cross-section and are intended to be retained in grooved tracks 47 cut into the bottom surface 41a of member 40. In the preferred embodiment, these two gaskets are also positioned on opposite sides of the bore 46 and hose connector 107. Drawing air from the frame through the hose connector 107 will cause a vacuum to be created between the glass master 42 and the rails 43 since the glass master 42 is sized so its outside edges overlap gaskets 108 as illustrated in FIG. 3.

Figure 6:
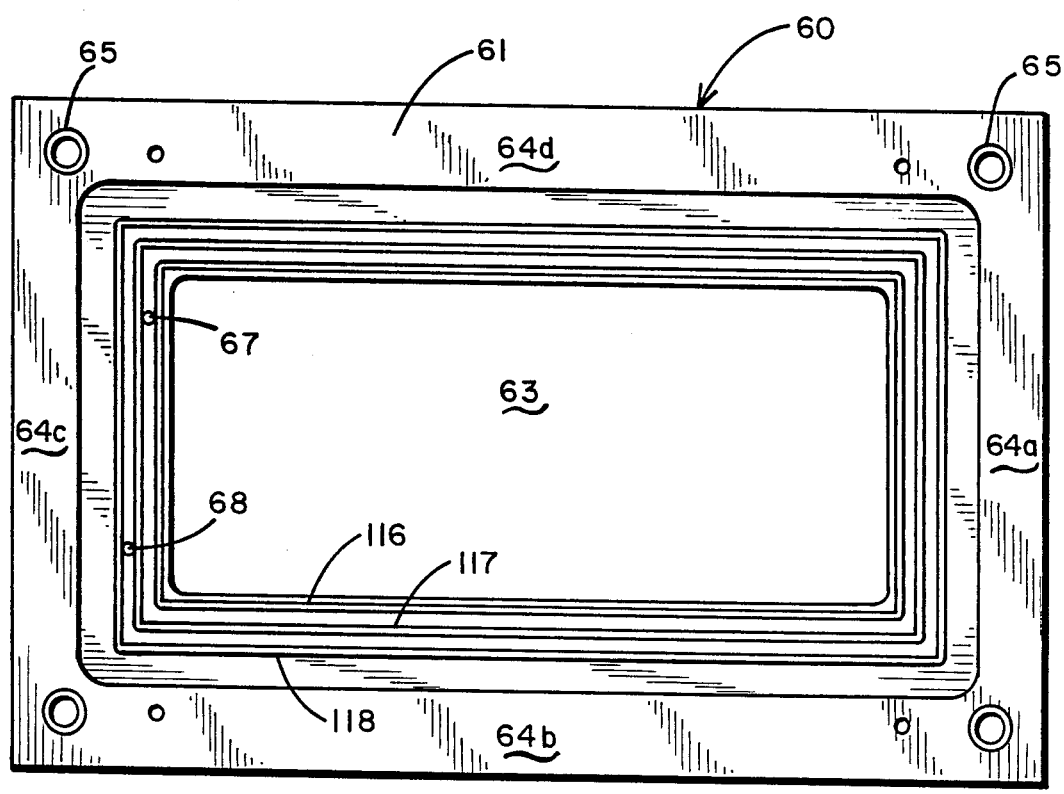
FIG. 6 is top view of the bottom plate taken along lines 6—6 in FIG. 2 and rotated 90°.

FIGS. 2, 3 and 6 show in detail the construction of the lower frame member 60. Frame member 60 has a bottom surface 62 and a top surface 61 which is intended to be placed in face-to-face registration with the bottom surface of member 40 when the frame of the present invention is in use. Member 60 also is characterized as being capable of receiving a glass master 63 and surrounding the main portion of glass master 63 with metal rails 64a, 64b, 64c and 64d of member 60.

Associated with each of the corners formed by the rails is a bore 65. Secured to the bottom surface 62 of member and projecting downwardly therefrom so as to be concentric with each of bores 65 is a separate threaded collar 110. After the threaded collars 110 have been secured to the bottom surface 62 of member 60, reciprocally threaded cylinders, indicated generally by numeral 111, are secured to each. Cylinders 111 include an elongated cylindrical section 112, a capped end 113 and an inlet 114. Inlet 114 is designed to include a fitting to which a pneumatic or hydraulic hose could be attached.

Also associated with each of bores 65 is a piston member 115 which is designed to ride up on down within bores 65 as air, vacuum, hydraulic, or pneumatic fluids are injected or evacuated from the cylinders 111 via the inlet 114. An important feature of piston members 115 is that their top surfaces 116 are concaved for receiving the spherical domes 102 associated with the corners of member 20. It is further contemplated that a mechanical or electromechanical device can be substituted for the pneumatic piston to adjust the elevation of member 115.

Another feature of member 60 are bores 66 which are positioned for alignment with bores 27 of member 20 and bores 45 of member 40. While bores 27 pass completely through member 20 and bores 45 pass completely through member 40, bores 66 pass approximately half way through member 60 from the top surface 61. Again, bores 66 are intended to receive tap pins 103 that have been passed through bores 27 and 45. Given this configuration, the tap pins 103 can be used to aid in positioning of the frame members and the substrate 120 upon which printing is to be done.

With reference to FIG. 6, associated with the top surface 61 of member 60 are three gaskets 116, 117 and 118. All three of these gaskets are retained by grooves cut into the top surface 61 of member 60 and completely surround the glass center 63. Located between gasket 116 and 117 is a bore 67 through the bottom member 60. Associated with bore 67 is a vacuum hose fitting (not shown). Similarly, member 60 has a bore 68 located between gaskets 117 and 118. Bore 68 also has a vacuum hose fitting (not shown) associated with it. When the frame is in use, separate vacuum hoses are attached to these fittings and a separate pumping means is attached to the other end of these hoses. The pump attached to bore 68 can be used to either draw air through bores 68 from the space between members 40 and 60 to hold them together or to push air between members 40 and 60 through bores 68 to force them apart depending on the desired mode of operation and the position of valve 130. More particularly, air pressure is applied to each cylinder 111 to open the frame. A positive pressure may have to be applied between frame members 40 and 60 after the vacuum pump is turned off. Either the vacuum has to be bled out or a small amount of air pressure applied before opening the frame. The pump attached to the fitting in bore 67 is used to create a vacuum between lower frame member 60 and those portions of the glass master 63 which overlap gaskets 116 and 117.

While it is believed that the preceding discussion provides a detailed description of the construction of the preferred embodiment of the frame of the present invention, the following discussion of its operation should enhance the reader's overall understanding.

When the exposure frame is in use, the first step is to insert a vacuum hose 106 through bore 30 of frame member 20 and then secure one end of hose 106 to hose connector 107. Next, members 20 and 40 are aligned using pins 103 and fastened together using threaded pins 104 and lug nut 105.

After members 20 and 40 have been fastened together, the glass master 42 is positioned on the bottom of member 40 so that the outside edges of glass master 42 completely covers both of gaskets 108. Using a pump, a suction is then applied via hose 106 through hose connector 107 and bore 46 to create a vacuum in the zone between the outside edges of the glass master 42 covering gaskets 108 and member 40 to hold the glass master firmly to member 40.

After a pump has been secured to fittings associated with bore 67 of the member 60 via a vacuum hose, glass master 63 is positioned on member 60 so that the outside edges of the glass master cover gaskets 116 and 117. Suction is then applied via these hoses to create a vacuum in the zone between gaskets 116 and 117, thus securing the outside edges of glass master 63 to the rails 64a–64d of member 60.

After the two glass masters have been secured to the corresponding frame members, The substrate upon which printing is to be performed is accurately aligned between the glass masters using alignment pins 103. Frame members 40 and 60 are then drawn together by applying a suction via bore 68, hose fitting 120, a vacuum hose and a pump. This suction creates a vacuum between members 40 and 60 in the area between gaskets 117 and 118.

Proper positioning of the masters is further ensured by the seating of the spherical domes 102 within the concaved top surface 116 of the pistons 115. Proper spacing between the glass masters and the substrate can also be controlled by adjusting the amount of fluid in cylinders 111. Alternatively, a gear and motor arrangement could replace the cylinders 111 as a means for controlling the height of the pistons 115.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to equipment details and operating procedures, can be accomplished without departing from the scope of the invention itself.

What is claimed is:

1. A printing frame for holding between two glass masters a substrate upon which printing is to be done, said printing frame comprised of:
   (a) first and second members, each having a top surface, a bottom surface, and four side rails surrounding an opening through its center;
   (b) means for aligning said first and second members in face-to-face registration and for securing said members together once they have been so aligned;
   (c) a third member having a top surface, a bottom surface, and four side rails surrounding an opening through its center;
   (d) means for securing one of said two glass masters to said second member and means for securing the other of said two glass masters to said third member; and
   (e) means for aligning said third member in face-to-face registration with said second frame member and means for securing said second and third members together once they have been so aligned.

2. The apparatus of claim 1 wherein said means for aligning said first and second members in face-to-face registration and for securing said members together once they have been so aligned include:
   (a) a plurality of bores through said first frame member; and
   (b) a plurality of pins projecting from said second member, said pins intended to mate with said bores of said first member when said first and second members are in desired alignment, some of said pins being threaded to receive a reciprocally threaded lug nut after being passed through the associated bores of the first frame member.

3. The apparatus of claim 1 wherein said means for securing one of said glass master to said second member includes:
   (a) a pair of gaskets surrounding the opening of said second members and fixed to the surface of said second member opposite said first member;
   (b) a bore through said second member, said bore positioned between said pair of gaskets; and
   (c) vacuum means for evacuating air through said bore from between said gaskets when said glass master is positioned to cover said gaskets.

4. The apparatus of claim 1 wherein said means for securing the other glass master to the third member includes:
   (a) a pair of gaskets surrounding the opening of said third member and fixed to the surface of said third member juxtaposed with said second member;
   (b) a bore through said second member, said bore positioned between said pair of gaskets; and
   (c) vacuum means for evacuating air through said bore from between said gaskets when said glass master is positioned to cover said gaskets.

5. The apparatus of claim 1 wherein said means for aligning said third member in face-to-face registration with said second member includes:
   (a) a plurality of shafts each of which terminate in a spherical dome projecting from an undersurface of said first member, each of said shafts passing through a separate bore through said second member;
   (b) a separate bore through said third member for each of said shafts;
   (c) a separate piston receiving cylinder positioned in each of said bores, each such piston terminating in a concaved surface for receiving said spherical domes; and
   (d) means for controlling the position of the piston within said piston receiving cylinder.

6. The apparatus of claim 1 wherein said means for securing said second and third members together includes:
   (a) a pair of gaskets;
   (b) a bore through one of said members in the area between said gaskets; and
   (c) vacuum means for evacuating air through said bore from between said gaskets after the second and third members have been aligned.

7. The apparatus of claim 1 further including aligned bores through said first and second members and partially through said third member for receiving alignment pins.

8. The apparatus of claim 3 wherein said vacuum means includes a valve which can be actuated to permit flow in a first direction, permit flow in an opposite second direction, or to prevent flow through the valve.

9. The apparatus of claim 4 wherein said vacuum means includes a valve which can be actuated to permit flow in a first direction, permit flow in an opposite second direction, or to prevent flow through the valve.

10. The apparatus of claim 6 wherein said vacuum means includes a valve which can be actuated to permit flow in a first direction, permit flow in the opposite direction, or to prevent flow through the valve.

* * * * *